United States Patent [19]

Etoh

[11] Patent Number: 5,625,313
[45] Date of Patent: Apr. 29, 1997

[54] CASCODE CIRCUIT OPERABLE AT A LOW WORKING VOLTAGE AND HAVING A HIGH OUTPUT IMPEDANCE

[75] Inventor: Toshiyuki Etoh, Tokyo, Japan

[73] Assignee: NEC Corporation, Japan

[21] Appl. No.: 304,389

[22] Filed: Sep. 12, 1994

[30] Foreign Application Priority Data

Sep. 13, 1993 [JP] Japan ..................... 5-226294

[51] Int. Cl.$^6$ ............... H03K 17/60; G06G 7/12
[52] U.S. Cl. ............ 327/486; 327/490; 327/562; 330/288; 330/291
[58] Field of Search ............... 327/490, 484, 327/486, 345, 590; 326/101, 102; 330/291, 288

[56] References Cited

U.S. PATENT DOCUMENTS

| | | | |
|---|---|---|---|
| 3,986,041 | 10/1976 | Buckley, III et al. | 307/205 |
| 4,518,869 | 5/1985 | Herold | 307/350 |
| 4,636,990 | 1/1987 | Buscaglia et al. | 365/230 |
| 4,728,815 | 3/1988 | Main | 307/261 |
| 4,777,472 | 10/1988 | Sauer et al. | 341/143 |
| 5,027,009 | 6/1991 | Urakawa et al. | 307/446 |
| 5,039,886 | 8/1991 | Nakamura et al. | 307/475 |
| 5,039,888 | 8/1991 | Bell et al. | 307/494 |
| 5,191,233 | 3/1993 | Nakano | 307/264 |
| 5,311,115 | 5/1994 | Archer | 323/315 |
| 5,329,177 | 7/1994 | Nagai | 307/451 |

FOREIGN PATENT DOCUMENTS

| | | |
|---|---|---|
| 525873 | 7/1992 | European Pat. Off. . |
| 59-12603 | 1/1984 | Japan . |

OTHER PUBLICATIONS

U. Gatti, et al., "Design and Verification of a CMOS Transconductance Cell With Extened Linearity", European Transaction On Telecommunications And Related Technologies, vol. 2, No. 4, Jul. 1991, pp. 441–446.

Primary Examiner—Timothy P. Callahan
Assistant Examiner—Kenneth B. Wells
Attorney, Agent, or Firm—Ostrolenk, Faber, Gerb & Soffen

[57] ABSTRACT

A cascode circuit includes a source-grounded input NMOS transistor having a gate connected to an input terminal and a drain connected through an output NMOS transistor to an output terminal. An amplification circuit is constructed by a gate-grounded third NMOS transistor having a source connected to the drain of the input transistor, a current mirror circuit consisting of PMOS transistors having an input current path connected to a drain of the third transistor, and a current source connected to an output current path of the constant mirror circuit as a load. An output from the amplification circuit is fed back to a gate of the second transistor. With this arrangement, the cascode circuit can maintain a high output impedance until a minimum output signal voltage reaches around 0.5 V, and can also have a minimum working supply voltage of about 2 V, and at the same time, a circuit construction suitable for IC in the CMOS process.

6 Claims, 4 Drawing Sheets

CASCODE CIRCUIT OPERABLE AT A LOW WORKING VOLTAGE AND HAVING A HIGH OUTPUT IMPEDANCE

BACKGROUND OF THE INVENTION

1. Field of the Invention

The present invention relates to a cascode circuit, and more particularly, to a cascode circuit configured to operate at a low working voltage and to have a wide amplitude output signal.

2. Description of Related Art

Conventional cascode circuits, commonly referred to as "regulated cascode" circuits are known. One example of this cascode circuit is disclosed in Japanese Patent Application Laid-open Publication No. JP-A-59-012503.

Referring to FIG. 1, there is shown a circuit diagram illustrating a cascode circuit disclosed in Laid-open Publication No. JP-A-59-012603. The cascode circuit of FIG. 1 comprises a pair of NMOS (N-channel MOS) transistors 1 and 2 connected in series between an output terminal 71 and a low voltage supply potential (ground), and an NMOS transistor 36 and a PMOS (P-channel MOS) transistor 37 connected in series between a high voltage supply potential $V_{DD}$ and the low voltage supply potential (ground). A gate electrode of the transistor 1 is connected to an input terminal 70, and a gate electrode of the transistor 36 is connected to a connecting node "A" between the transistors 1 and 2. A gate electrode of the transistor 2 is connected to a connecting node "D" between the transistors 35 and 37. A voltage source VG is connected between a gate electrode and a drain electrode of the transistor 37.

This cascode circuit has a powerful negative feedback loop, which is constituted of an amplification circuit composed by the transistors 2 and 36, so that a source potential of the transistor 2 is fixed by a gate-source voltage of the transistor 36, that is to say, by a gate potential of the transistor 36.

Thus, a drain current, which is determined in accordance with an input voltage supplied to the gate electrode of the transistor 1, is almost free from the effect of a direct current potential of the output terminal 71. Therefore, the output current becomes constant, and it has an extremely high output impedance. As a result, it is possible to obtain a large amplification factor when this circuit is used in an amplification stage of an operational amplifier.

As mentioned above, in the conventional cascode circuit, a lower limit value of a working voltage at the output terminal is substantially determined by a gate-source voltage of the transistor 36, the value being about 1 V in a usual CMOS (complimentary metal oxide semiconductor) process. In addition, the lower limit value of the working voltage $V_{DD}$ is a saturated voltage of the transistor 37 added with respective gate-source voltages of the transistor 2 and 36. Namely, it is about 2.5 volts.

Therefore, there is a disadvantage that, when operated at a low working voltage (for example, 3 volts), a dynamic range of an output signal at the output terminal becomes narrow, which causes a shortage of margin of a bias point in comparison with a voltage supply voltage.

SUMMARY OF THE INVENTION

Accordingly, it is an object of the present invention to provide a cascode circuit which has overcome the above mentioned defect of the conventional one.

Another object of the present invention is to provide a cascode circuit which has a low lower limit of the working voltage in the COMS process, and at the same time, which has a large amplitude of an output signal.

The above and other objects of the present invention are achieved in accordance with the present invention by a cascode circuit including a series-connected circuit composed of first and second transistors series-connected between an output terminal and a low voltage supply potential or a high voltage supply potential, and an input terminal connected to a gate electrode of the second transistor, so that a potential at a series-connecting node within the series-connected circuit is compared with a predetermined potential, with the result that conduction of the first transistor is controlled on the basis of the result of the comparison. The cascode circuit is characterized in that the change of the potential at the series-connecting node in response to an input signal supplied from the input terminal is fed back to a gate electrode of the first transistor by means of a negative feedback mean including a current mirror circuit, so that a margin of amplitude in an output signal obtained from the output terminal is increased.

In addition, the negative feedback mean includes a gate grounded third transistor having a source electrode connected to the above mentioned series-connecting node, a current mirror circuit constituted of a pair of transistors which are of the channel type opposite to that of the first, second and third transistors and which have a gate electrode connected to each other as well as to a drain electrode of one of the pair of transistors acting as an input terminal of the current mirror circuit, a drain of the other of the pair of transistors constituting an output terminal, and a constant current source connected to the output terminal as a load of the current mirror circuit, the input terminal of the current mirror circuit being connected to a drain electrode of the third transistor, and the output terminal of the current mirror circuit being connected to the gate electrode of the first transistor.

The above and other objects, features and advantages of the present invention will be apparent from the following description of preferred embodiments of the invention with reference to the accompanying drawings.

BRIEF DESCRIPTION OF THE DRAWINGS

FIG. 5 is a circuit diagram of a third embodiment of the cascode circuit of the present invention.

DETAILED DESCRIPTION OF THE PREFERRED EMBODIMENTS

Figure 1:
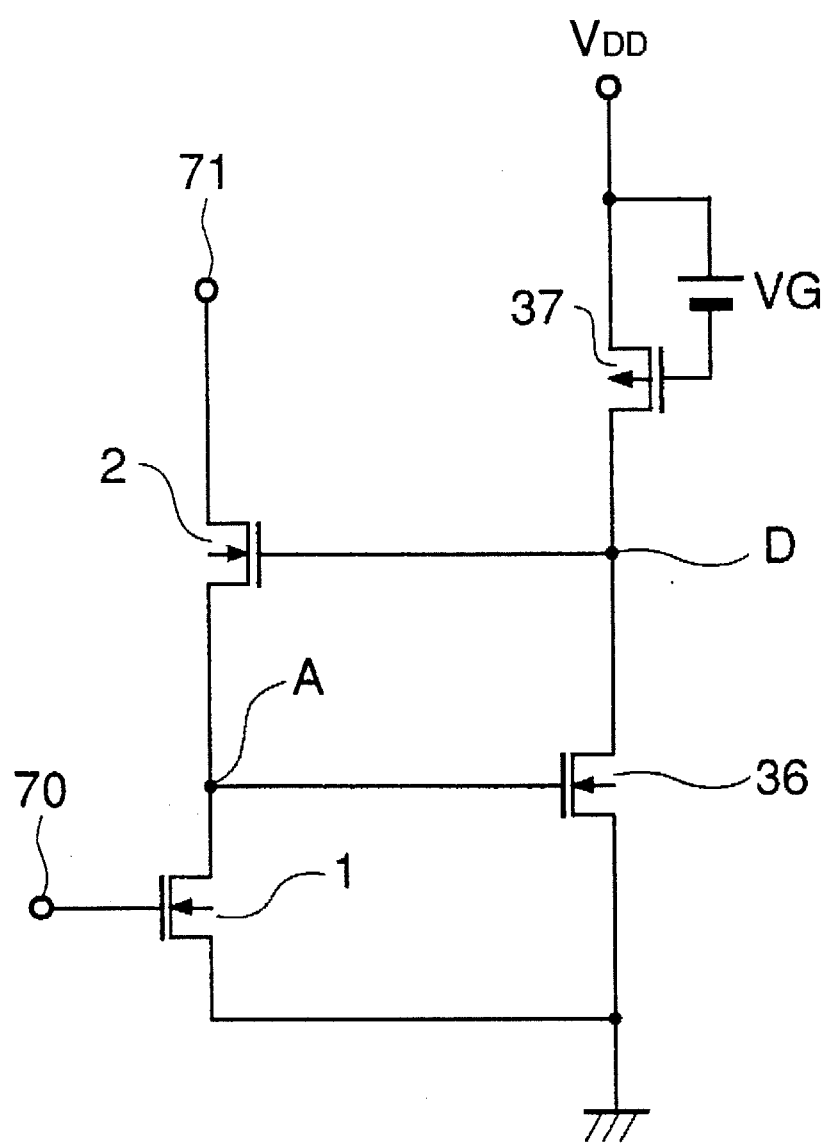
FIG. 1 is a circuit diagram of a conventional cascode circuit.
Figure 2:
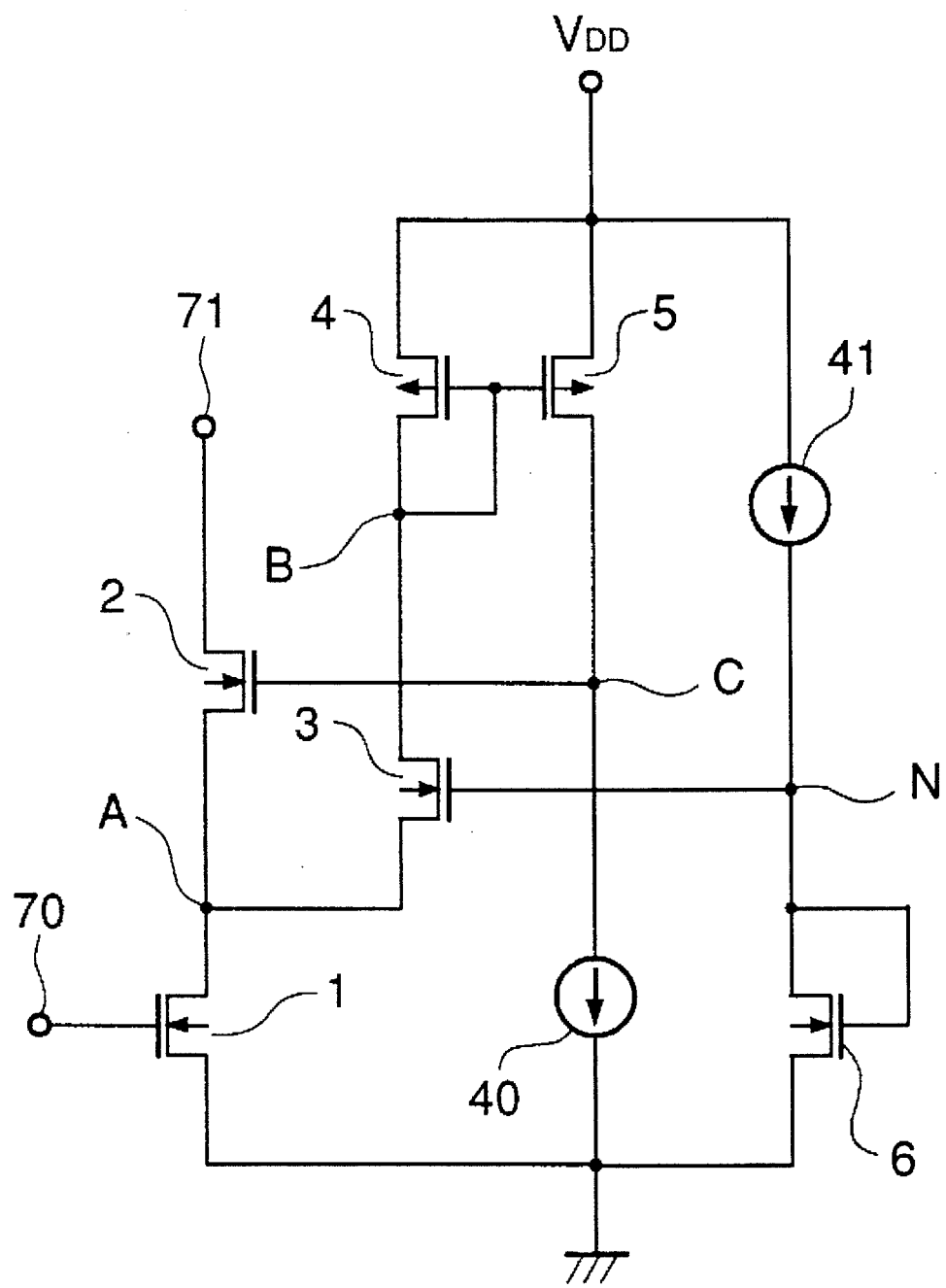
FIG. 2 is a circuit diagram of a first embodiment of the cascode circuit of the present invention.

Referring to FIG. 2, there is shown a circuit diagram of a first embodiment of the cascode circuit of the present invention.

The cascode circuit of FIGS. 2 includes a series circuit composed of a pair of NMOS transistors 1 and 2 connected in series between an output terminal 71 and a low voltage supply potential GND. An input terminal 70 is connected to a gate electrode of the transistor 1. A source electrode of an NMOS transistor 3 is connected to a series-connecting node "A" between the transistors 1 and 2, and a gate of the transistor 3 is connected to a series-connecting node "N" in a series-circuit consisting of a constant current source 41 and an NMOS transistor 6 series-connected between a high voltage supply potential $V_{DD}$ and a low voltage supply potential GND so that the gate of the transistor 3 is grounded through the transistor 6. The constant current source 41 is connected to the high voltage supply potential $V_{DD}$ and to a gate and a drain of the NMOS transistor 6. A source of the transistor 6 is connected to the low voltage supply potential GND. Therefore, a voltage generation circuit for fixing the gate potential of the transistor 3 is composed of the transistor 6 and the constant current source 41.

A current mirror circuit is composed of a pair of PMOS transistors 4 and 5 which are of the channel type opposite to that of the transistors 1, 2 and 3. A source of each of the transistors 4 and 5 is connected to the high voltage supply potential $V_{DD}$ so as to be supplied with a current from the high voltage supply potential $V_{DD}$. A gate of the transistor 4 is connected to a drain of the transistor 4 itself and to a gate of the transistor 5. A constant current source 40 is connected to a drain of the transistor 5 as a load of the transistor 5 and to the low voltage supply potential GND. An input terminal "B" and an output terminal "C" of the current mirror circuit are connected to a drain electrode of the transistor 3 and a gate electrode of the transistor 2, respectively.

The cascode circuit described above has a negative feedback loop of one gain stage passing through the transistors 3→4→5→2→3. Therefore, the drain potential of the transistor 1 is firmly fixed. Consequently, a drain current of the transistor 1, which is determined by a voltage applied to the voltage input terminal 70, is almost free from the effect of a direct current potential of the current output terminal 71. This makes an output impedance of this cascode circuit very high.

Now, the output impedance will be analyzed. Given transconductances of the transistor 2 and 3 are $g_{m2}$ and $g_{m3}$, respectively and output impedances of the transistors 1, 2, 5 and the constant current source 40 are $r_{o1}$, $r_{o2}$, $r_{o5}$ and $r_{ocs}$ respectively, an output impedance Zout is expressed as follows:

$$Zout = \mu \cdot g_{m2} \cdot r_{o1} r_{o2} \qquad (1)$$

in which, $\mu$ represents an amplification factor of the signal path passing through the transistors 3→4→5, and $$g = g_{m2} \cdot g_{m3} \{r_{o5} \cdot r_{ocs}/(r_{o5}+r_{ocs})\}/(g_{m2}+g_{m3}) \qquad (2)$$

Here, assuming that $g_{m2} \gg g_{m3}$, Zout is expressed as follows:

$$Zout = g_{m2} \cdot g_{m3} \cdot (r_{o5} \cdot r_{ocs}/(r_{o5}+r_{ocs})) r_{o1} \cdot r_{o2} \qquad (3)$$

As a result, Zout is on the order of $g_m^2 r_o^3$. Therefore, it would be understood that it has an output impedance which is as high as that of conventional circuits.

Next, a dynamic range of the output will be considered. The lower limit of the working voltage at the current output terminal 71 is almost equal to a drain voltage $V_{D1}$ of the transistor 1. If a source-gate voltage of the transistors 3 and 6 are represented by $V_{GS3}$ and $V_{GS6}$:

$$V_{D1} = V_{GS6} - V_{GS3} \qquad (4)$$

Therefore, by setting $V_{GS3}$ and $V_{GS6}$ at predetermined values, it is possible to make $V_{D1}$ about 0.5 V. This is a sufficient value of a voltage at which the transistor 1 manufactured in the standard CMOS process can operate in a saturated region. In addition, the value of $V_{D1}$ is not affected by the change of a threshold of the transistors 3 and 6 if the values of the constant current sources 40 and 41 are constant. Therefore, the transistor 1 is biased in a stable manner.

Specifically, assuming that a gate width of the transistors 3 and 6 are W3 and W6, respectively, and a gate length of the transistors 3 and 6 are L3 and L6, respectively, and also assuming that a threshold value of the transistors 3 and 6 are VT, a drain current $I_{D3}$ and $I_{D6}$ of the transistors 3 and 6 can be expressed as follows:

$$I_{D3} = \frac{1}{2} \beta_3 (V_{GS3} - V_T)^2 \qquad (5)$$

$$I_{D6} = \frac{1}{2} \beta_6 (V_{GS6} - V_T)^2 \qquad (6)$$

where $$\beta_i = \mu_n C_{ox} \frac{W_i}{L_i} \quad (i = 3, 6)$$

$\mu_n$=surface mobility
$C_{ox}$=gate capacitance per unit area
Therefore, $$V_{GS3} = \sqrt{\frac{2I_{D3}}{\beta_3}} + V_T \qquad (7)$$

$$V_{GS6} = \sqrt{\frac{2I_{D6}}{\beta_6}} + V_T \qquad (8)$$

Accordingly, if the equations (7) and (8) are substituted into the equation (4), $$\begin{aligned} V_{D1} &= V_{GS6} - V_{GS3} \\ &= \sqrt{\frac{2I_{D6}}{\beta_6}} - \sqrt{\frac{2I_{D3}}{\beta_3}} \end{aligned} \qquad (9)$$

Accordingly, if $V_{GS3}$ and $V_{GS6}$ are set to the predetermined values by determining the transistor size and the current of the transistors 3 and 6 in accordance with the above mentioned equations, $V_{D1}$ can be made about 0.5 V.

For example, if it is designed that W3/L3=400/2.5, W6/L6=50/45, $I_{D3}=I_{D6}$=20 μA, $\mu_n$=540 cm$^2$/V·sec, and $C_{ox}$=2.16×10$^{-7}$F/cm$^2$, $V_{D1}$=0.51 V can be obtained.

Figure 3:
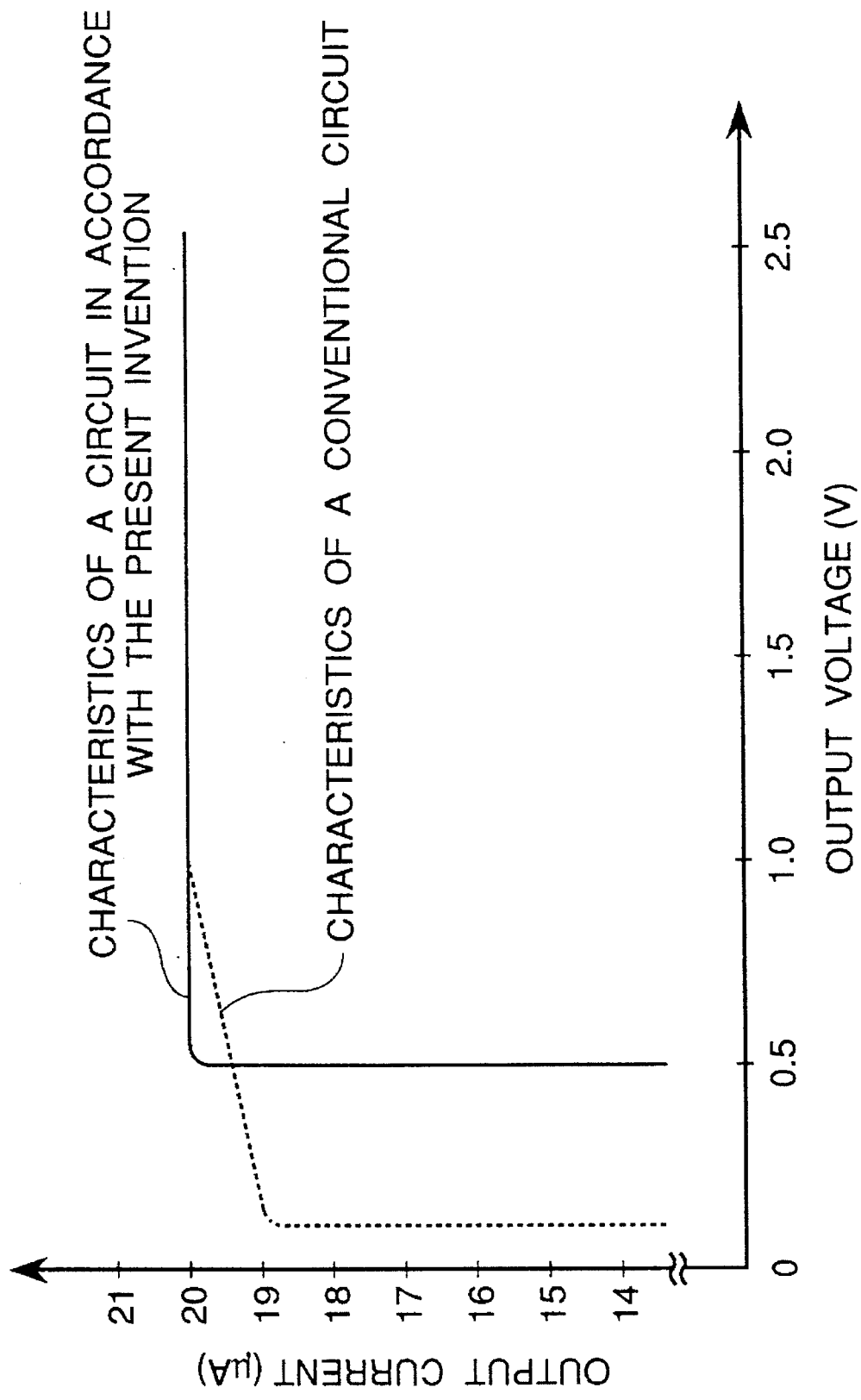
FIG. 3 is a graph showing characteristics of the cascode circuit in accordance with the present invention and the conventional cascode circuit.

Referring to the FIG. 3, which shows the relation between an output voltage (direct current potential) and an output current at the output current terminal 71, the profile represented by a solid line shows a characteristics of the circuit in accordance with the present invention, and the profile represented by a dashed line shows a characteristics of a conventional circuit.

In the circuit in accordance with the present invention, the output current is kept constant until the output voltage is reduced to 0.5 V, but in the case of the conventional circuit, the output current begins to fall when the output voltage reaches 1 V. This means that the output impedance falls with 1 V or less.

On the other hand, the voltage supply voltage when operating at a low voltage is a saturated voltage of the transistor 1 plus a saturated voltage of the transistor 5 plus the gate-source voltage of the transistor 2. This is about 2 V. This value is smaller than 2.5 V, which is the voltage supply voltage of the conventional circuit operating at a low voltage, by 0.5 V.

Figure 4:
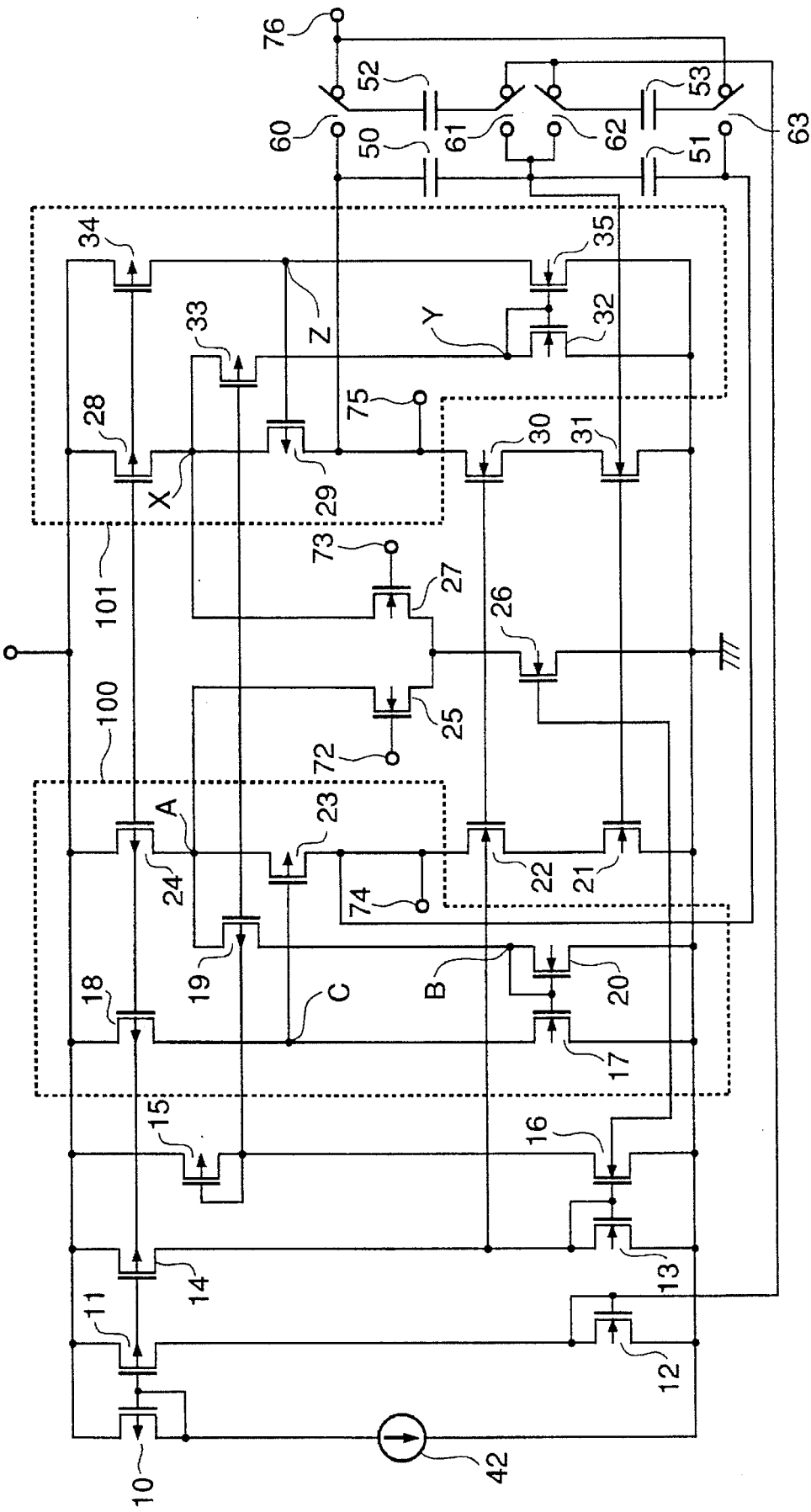
FIG. 4 is a circuit diagram of a second embodiment of the cascode circuit in accordance with the present invention.

Referring to the FIG. 4 which shows a circuit diagram of a second embodiment, there is shown a balanced output circuit in which the cascode circuit in accordance with the present invention is used in an output stage of an operational amplifier circuit. In this embodiment, cascode circuits 100 and 101 comprising transistors 15~20, 23, 24 and transistors 28, 29, 32~35 connected as shown, respectively, correspond to the first embodiment of the cascode circuit in accordance with the present invention, in which, however, the P channel type and the N channel type of MOS transistors are substituted by the N channel type and the P channel type of MOS transistors, respectively. This operational amplifier comprises the cascode circuits 100 and 101 in its output stage.

The cascode circuit 100 comprises a series circuit of PMOS transistors 23 and 24 series-connected between an output terminal 74 and a high voltage supply potential $V_{DD}$, a gate-grounded PMOS transistor 19 having a source electrode connected to a series-connecting node "A", a current mirror circuit consisting of a pair of NMOS transistors 17 and 20 having the channel type opposite to that of the transistors 19, 23 and 24, and a PMOS transistor 18 connected to the high voltage supply potential $V_{DD}$ to constitute a load of the transistor 17. A drain electrode of the transistor 19 is connected to a drain and a gate electrode of the transistor 20, and a connecting node C between the transistor 17 of the current mirror circuit and the load transistor 18 is connected to a gate electrode of the transistor 23.

The cascode circuit 101 has the same construction as the cascode circuit 100. The transistors 17, 18, 19, 20, 23 and 24 and the connecting nodes "A", "B" and "C" in the cascode circuit 100 correspond to transistors 35, 34, 33, 32, 29 and 28 and connecting nodes "X", "Y" and "Z" in the cascode circuit 101, respectively.

In an input stage,-on the other hand, input terminals 72 and 73 are connected to a gate electrode of a differential pair of NMOS transistors 25 and 27, respectively, which have a source connected in common. A constant current source NMOS transistor 26 is connected between a low voltage supply potential GND and the common-connected source electrodes of the differential pair of transistors 25 and 27. Drain electrodes of the differential pair of transistors 25 and 27 are connected to the connecting node "A" of the cascode circuit 100 and the connecting node "X" of the cascode circuit 101, respectively.

The output terminals 74 and 75 are connected to the lower supply potential GND by means of NMOS transistors 21 and 22, and NMOS transistors 30 and 31, respectively. Gate electrodes of the transistor 19 and 33 are supplied with one output potential of a constant current source, which is composed of a current mirror circuit consisting of a pair of NMOS transistors 13 and 16 as well as load PMOS transistors 14 and 15 connected as shown. The other output potential of this constant current source is supplied to a gate electrode of the transistors 22 and 30.

Gate electrodes of the transistors 18 and 24 and the transistors 28 and 34 are supplied with one output potential of another constant current source composed of a current mirror circuit consisting of a pair of PMOS transistors 10 and 11 as well as a load NMOS transistor 12 and a constant current source 42. The other output potential of this constant current source is selectively connected to a terminal 76 via switching elements 60, 61 and 62, 63 and capacitors 52 and 53 connected as shown. The terminal 76 is supplied with a reference voltage.

The output terminals 74 and 75 are connected to gate electrodes of the transistors 21 and 31 by means of capacitors 51 and 50. The capacitors 52 and 53 are selectively connected in parallel to the capacitors 51 and 50, respectively, by the switching elements 60, 61 and 62, 63.

Owing to the structure described above, it is possible to extend a dynamic range and to obtain an amplification factor corresponding to two gain stages by only one gain stage. In addition, a current consumption is greatly reduced, and at the same time, it also has a wide-band property which is a characteristics of a one stage amplification circuit.

The operation will be omitted since it is the same as that of a conventional operational amplification circuit.

As described above, according to the present invention, it is advantageously possible to obtain the minimum working voltage (between the output terminal and the high or low voltage supply potential) of about 0.5 V even in a conventional CMOS process. And it is also possible to obtain an output impedance which is as high as that of conventional regulated cascode circuit, and the minimum working supply voltage of about 2 V, by employing the gate-grounded transistor and the feedback amplification circuit.

FIG. 5 illustrates a third embodiment of the cascode circuit of the present invention. The circuit of FIG. 5 operates on the same principles as the first embodiment of the present invention as shown in FIG. 2, except that the N-channel transistors of FIG. 2 are substituted by P-channel transistors and likewise the P-channel transistors of FIG. 2 are substituted by N-channel transistors. Also, the direction of current flow in the circuit of FIG. 5 is opposite to that of FIG. 2. Since the principles of operation of the cascode circuit of FIG. 5 are the same as that of FIG. 2, numeral designations in FIG. 5 are the same as such designations in FIG. 2.

The invention has thus been shown and described with reference to the specific embodiments. However, it should be noted that the present invention is in no way limited to the details of the illustrated structures but changes and modifications may be made within the scope of the appended claims.

I claim:

1. A cascode circuit comprising:
   a first MOS transistor of N-channel type having a gate connected to an input terminal of the cascode circuit and a source connected to ground;
   a second MOS transistor of N-channel type having a drain connected to an output terminal of the cascode circuit and a source connected to a drain of said first MOS transistor, so that a series connection of said first and second MOS transistors is constituted between said ground and said output terminal;
   a third MOS transistor of N-channel type having a source connected to a series-connecting node between said first and second MOS transistors and a gate connected to a fixed voltage generated by a bias voltage generating circuit; and
   a current mirror circuit comprising fourth and fifth MOS transistors of P-channel type having sources connected in common to a voltage supply potential, a gate of said fourth MOS transistor being connected to a gate of said fifth MOS transistor, a drain of said fourth MOS transistor and a drain of said third MOS transistor, a drain of said fifth MOS transistor being connected through a first constant current source to said ground and also to a gate of said second MOS transistor, so that a negative feedback loop is formed to start from said series-connecting node between said first and second MOS transistors, to pass through said third MOS transistor, said fourth MOS transistor, said fifth MOS transistor and said second MOS transistor in the named order, to return to said series-connecting node between said first and second MOS transistors.

2. A cascode circuit claimed in claim 1, wherein said voltage generating circuit includes a second constant current source having one end connected to said voltage supply potential, and a sixth MOS transistor of N-channel type having a gate and a drain connected in common to the other end of said second constant current source and a source connected to said ground, a connection node between said second constant current source and said sixth MOS transistor being connected to said gate of said third MOS transistor.

3. A cascode circuit comprising:
   a first MOS transistor of P-channel type having a gate connected to an input potential and a source connected to a voltage supply potential;
   a second MOS transistor of P-channel type having a drain connected to an output terminal of the cascode circuit and a source connected to a drain of said first MOS transistor, so that a series connection of said first and second MOS transistors is constituted between said voltage supply potential and said output terminal;
   a third MOS transistor of P-channel type having a source connected to a series-connecting node between said first and second MOS transistors and a gate connected to a fixed voltage generated by a bias voltage generating circuit; and
   a current mirror circuit comprising fourth and fifth MOS transistors of N-channel type having sources connected in common to a ground, a gate of said fourth MOS transistor being connected to a gate of said fifth MOS transistor, a drain of said fourth MOS transistor and a drain of said third MOS transistor, a drain of said fifth MOS transistor being connected through a first constant current source to said voltage supply potential and also to a gate of said second MOS transistor,
   so that a negative feedback loop is formed to start from said series-connecting node between said first and second MOS transistors, to pass through said third MOS transistor, said fourth MOS transistor, said fifth MOS transistor and said second MOS transistor in the named order, to return to said series-connecting node between said first and second MOS transistors.

4. A cascode circuit claimed in claim 3, wherein said voltage generating circuit includes:
   a sixth MOS transistor of P-channel type having a source connected to said voltage supply potential, and a gate and a drain connected in common to said gate of said third MOS transistor, and a second current mirror circuit comprising seventh and eight MOS transistors of N-channel type having respective sources connected in common to said ground, said seventh MOS transistor having a drain connected to said drain of said sixth MOS transistor, and a gate connected to a gate and a drain of said eighth MOS transistor acting as a current input.

5. A cascode circuit comprising:
   a series connection of first and second transistors with the drain of the first transistor connected to the source of the second transistor by a series-connecting node, a drain of said second transistor connected to an output terminal of said cascode circuit, and a source of said first transistor connected to a ground potential;
   an input terminal connected to a gate electrode of said first transistor, so that a potential at said series-connecting node is compared with a potential of said output terminal of said cascode circuit, with the result that conduction of said first transistor is based on the result of the comparison, the change of the potential at said series-connecting node in response to an input signal supplied from said input terminal is fed back to a gate electrode of said second transistor by a negative feedback means including a current mirror circuit, so that amplification of an output signal obtained from said output terminal is increased;
   said negative feedback means includes a third transistor having a gate electrode biased to a fixed voltage and a source electrode connected to said series-connecting node, said first, second and third transistors are of the same channel type, said current mirror circuit constituted by fourth and fifth transistors which are of a channel type opposite to that of said first, second and third transistors and which have a gate electrode connected to each other as well as to a drain electrode of said fourth transistors with said drain electrode of said fourth transistor being an input terminal of said current mirror circuit, a drain of said fifth transistor being an output terminal of said current mirror circuit, and a constant current source connected to said output terminal of said current mirror circuit as a load of said current mirror circuit, said input terminal of said current mirror circuit being connected to a drain electrode of said third transistor, and said output terminal of said current mirror circuit being connected to the gate electrode of said second transistor.

6. A cascode circuit comprising:
   a series connection of first and second transistors with the drain of the first transistor connected to the source of the second transistor by a series-connecting node, a drain of said second transistor connected to an output terminal of the cascode circuit, and a source of said first transistor connected to a voltage supply potential;
   an input terminal connected to a gate electrode of said first transistor, so that a potential at said series-connecting node is compared with a potential of said output terminal of said cascode circuit, with the result that conduction of said first transistor is based on the result of the comparison, the change of the potential at said series-connecting node in response to an input signal supplied from said input terminal is fed back to a gate electrode of said second transistor by a negative feedback means including a current mirror circuit, so that amplification of an output signal obtained from said output terminal is increased;
   said negative feedback means includes a third transistor having a gate electrode biased to a fixed voltage and a source electrode connected to said series-connecting node, said first, second and third transistors are of the same channel type, said current mirror circuit constituted by fourth and fifth transistors which are of a channel type opposite to that of said first, second and third transistors and which have a gate electrode connected to each other as well as to a drain electrode of said fourth transistors with said drain electrode of said fourth transistor being an input terminal of said current mirror circuit, a drain of said fifth transistor being an output terminal of said current mirror circuit, and a constant current source connected to said output terminal of said current mirror circuit as a load of said current mirror circuit, said input terminal of said current mirror circuit being connected to a drain electrode of said third transistor, and said output terminal of said current mirror circuit being connected to the gate electrode of said second transistor.

* * * * *